(12) United States Patent
Vorraro et al.

(10) Patent No.: US 7,184,310 B2
(45) Date of Patent: Feb. 27, 2007

(54) SEQUENTIAL PROGRAM-VERIFY METHOD WITH RESULT BUFFERING

(75) Inventors: Giovanni Francesco Vorraro, Naples (IT); Paolo Villani, Naples (IT)

(73) Assignees: STMicroelectronics S.r.l., Agrate Brianza (IT); Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/093,012

(22) Filed: Mar. 29, 2005

(65) Prior Publication Data
US 2005/0232019 A1    Oct. 20, 2005

(30) Foreign Application Priority Data
Mar. 30, 2004    (EP) .................................. 04101301

(51) Int. Cl.
G11C 16/34    (2006.01)
(52) U.S. Cl. .............................. 365/185.17; 365/185.22
(58) Field of Classification Search ............ 365/185.17
See application file for complete search history.

(56) References Cited

U.S. PATENT DOCUMENTS

| | | | |
|---|---|---|---|
| 4,763,305 A * | 8/1988 | Kuo ....................... | 365/185.22 |
| 5,123,016 A | 6/1992 | Müller et al. ............... | 371/10.3 |
| 5,321,699 A * | 6/1994 | Endoh et al. .......... | 365/185.17 |
| 6,414,876 B1 * | 7/2002 | Harari et al. .......... | 365/185.22 |
| 6,687,862 B1 | 2/2004 | Martinez ..................... | 714/723 |
| 6,717,857 B2 | 4/2004 | Byeon et al. | |
| 6,937,522 B2 * | 8/2005 | Funaki ................... | 365/185.22 |
| 2003/0147293 A1 | 8/2003 | Geraci et al. ............... | 365/201 |

\* cited by examiner

*Primary Examiner*—Tan T. Nguyen
(74) *Attorney, Agent, or Firm*—Lisa K. Jorgenson; Robert Iannucci; Seed IP Law Group PLLC

(57) ABSTRACT

A sequential program-verify method is used in a non-volatile memory device including a plurality of memory cells each one for storing a logic value, the cells being arranged into a plurality of alignments. The method includes the steps of: writing a set of target values into a plurality of blocks of cells, the corresponding cells of each block belonging to a common alignment, verifying each block of cells in succession to assert a fault value for each alignment in response to a non-compliance of the value stored in the cell of the block belonging to the alignment with the corresponding target value, buffering the fault values, and in response to the verification of all the blocks of cells providing an indication of the alignments being defective according to the fault values.

15 Claims, 3 Drawing Sheets

SEQUENTIAL PROGRAM-VERIFY METHOD WITH RESULT BUFFERING

BACKGROUND OF THE INVENTION

1. Field of the Invention

The present invention relates to the non-volatile memory field, and more specifically to a sequential program-verify method for use in a non-volatile memory device.

2. Description of the Related Art

Non-volatile memory devices (such as $E^2PROM$ of the flash type) are commonly used in several applications when the data stored in the memory device must be preserved even if a power supply is off. Typically, the memory device includes a matrix of memory cells (for example, arranged in rows and columns according to a NAND architecture); the matrix is partitioned into pages, each one consisting of a block of cells (such as 8) that are read or written at the same time.

The production process of the memory devices includes a series of test procedures, which are used to check their operative characteristics. For example, in a sequential program-verify procedure a predefined data pattern is written throughout the whole matrix. The pages of the matrix are then read in succession and compared with the expected values. Whenever a cell has not been written correctly, the corresponding column of the matrix is rejected as defective. The matrix includes a set of redundant columns, which are used to replace the defective columns.

In the sequential program-verify procedures known in the art, the indication of any defective columns must be output immediately after verifying the corresponding page. Indeed, the result of the verification is available in a latch structure (such as a page buffer), which is used to read the values stored in the page; therefore, if the content of the latch structure was not dumped, the information would be overridden by the reading of the next page.

A drawback of the solution described above is that the sequential program-verify procedure must be suspended (for outputting the indication of the defecting columns) whenever an error condition is detected. As a consequence, the length of the program-verify procedure is strongly increased. This drawback has a deleterious effect on the performance of the production process of the memory devices and then on their overall cost.

BRIEF SUMMARY OF THE INVENTION

One embodiment of the present invention provides a method of testing a non-volatile memory device that does not require testing to be suspended whenever an error condition is detected. The method accumulates the results of the verifications (for their outputting at the end of the procedure). One advantage of the method is a reduction in the length of the procedure. The method also improves the performance of the production process of the memory devices, and then reduce their overall cost.

One embodiment of the present invention provides a sequential program-verify method for use in a non-volatile memory device including a plurality of memory cells each one for storing a logic value, the cells being arranged into a plurality of alignments, wherein the method includes the steps of: writing a set of target values into a plurality of blocks of cells, the corresponding cells of each block belonging to a common alignment, verifying each block of cells in succession to assert a fault value for each alignment in response to a non-compliance of the value stored in the cell of the block belonging to the alignment with the corresponding target value, buffering the fault values, and in response to the verification of all the blocks of cells, providing an indication of the alignments being defective according to the fault values.

Moreover, a corresponding non-volatile memory device is also encompassed.

BRIEF DESCRIPTION OF THE SEVERAL VIEWS OF THE DRAWINGS

Further features and the advantages of the solution according to the present invention will be made clear by the following description of a preferred embodiment thereof, given purely by way of a non-restrictive indication, with reference to the attached figures, in which.

DETAILED DESCRIPTION OF THE INVENTION

Figure 1:
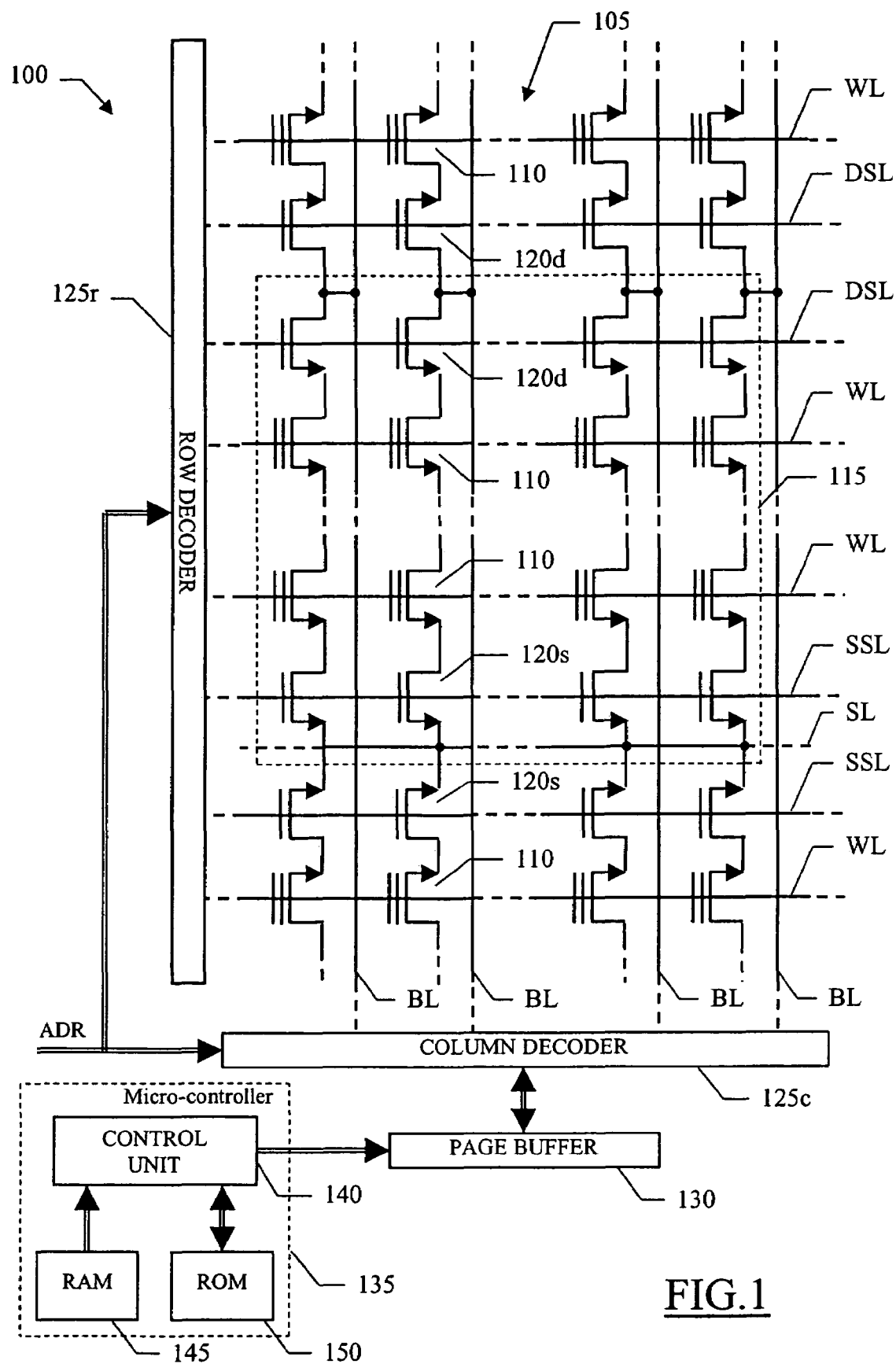
FIG. 1 depicts the functional blocks of a non-volatile memory device in which the method of the invention is applicable.

With reference in particular to FIG. 1, a non-volatile memory device 100 (consisting of an $E^2PROM$ of the flash type) is illustrated. The flash memory 100 is integrated in a chip of semiconductor material, and includes a matrix 105 (or more) of memory cells 110; typically, each cell 110 consists of a floating gate NMOS transistor. In an erased condition, the cell 110 has a low threshold value (associated with a logic value 1). The cell 110 is programmed by injecting electric charges into its floating gate; in this condition, the cell 110 has a high threshold value (associated with a logic value 0). Therefore, when a selected cell 110 is biased for reading, the cell 110 will be conductive if erased or non-conductive if programmed.

The cells 110 are organized into a plurality of rows (for example, 2048) and a plurality of columns (for example, 4096). The flash memory 100 has a so-called NAND architecture. In this configuration, the matrix 105 is partitioned into multiple sectors 115. Each sector 115 includes a plurality of strings (for example, 16), which are connected in parallel; in turn, each string is formed by a set of cells 110 (for example, 16), which are connected in series between a source select NMOS transistor 120s and a drain select NMOS transistor 120d.

More in detail, an intermediate cell 110 of each string has the drain terminal that is connected to the source terminal of an adjacent cell 110, and the source terminal that is connected to the drain terminal of another adjacent cell 110. An end cell 110 of the string has the drain terminal that is connected to the source terminal of the drain select transistor 120d; the drain terminal of the drain select transistor 120d is connected to the drain terminal of the corresponding drain select transistor 120d of an adjacent sector. Likewise, the other end cell 110 of the string has the source terminal that is connected to the drain terminal of the source select transistor 120s; the source terminal of the source select transistor 120s is connected to the source terminal of the corresponding source select transistor 125s of another adjacent sector.

The control gate terminals of the cells 110 in each row are connected to a corresponding word line WL. The gate terminals of the drain select transistors 120d belonging to a common row are connected to a corresponding drain select line DSL; on the other hand, the gate terminals of the source select transistors 120s belonging to a common row are connected to a corresponding source select line SSL. The drain terminals of the drain select transistors 120d belonging to a common column are connected to a corresponding bit line BL. Conversely, the source terminals of all the source select transistors 120s in the matrix 105 are connected to a common source line SL (which is typically kept at a reference voltage, or ground).

In each sector 115, the cells 110 belonging to the same row are logically partitioned into two pages that are processed simultaneously (each one consisting of 8 cells in the example at issue); particularly, a first page consists of the cells 110 in an even position and a second page consists of the cells 110 in an odd position.

The flash memory 100 receives an address ADR for selecting a desired page. A portion of the address ADR is supplied to a row decoder 125r, which selects the desired word line WL and the drain select line DSL and source select line SSL of the corresponding sector 115. Another portion of the address ADR is supplied to a column decoder 125c; the column decoder 125c connects the desired bit lines BL to a page buffer 130, which is used to read/write the cells 110 of the selected page.

Operation of the flash memory 100 is managed by a micro-controller 135. Particularly, the micro-controller 135 includes a control unit 140 that drives the page buffer 130. The control unit 140 uses a RAM 145 as a working memory. Operation of the unit 140 is controlled by a low-level software program (or firmware), which is stored in a ROM 150.

All the cells 110 of the matrix 105 are erased at the same time (to the logic value 1). On the other hand, during a read operation a word (consisting of 8 bits) being stored in the selected page is latched into the page buffer 130. Conversely, during a write operation a target word is loaded into the page buffer 130; the cells 110 of the selected page to be brought to the logic value 0 are then programmed (while the other cells 110 are left unchanged). Typically, the cells 110 are read immediately after being programmed, in order to verify the success of the operation (with a procedure known as program-verify). The memory device 100 also supports a sequential program-verify function, which is typically implemented programming all the cells 110 of the matrix 105.

Similar considerations apply if the matrix, the sectors, and/or the pages have different sizes, or if the memory cells are implemented with other components (even of the multi-level type). In any case, the concepts of the present invention are also applicable when the flash memory has a different structure or includes other units (for example, replacing the micro-controller with equivalent logic means); moreover, it should be noted that the rows and columns are only topological definitions, and can be implemented with any other geometrical alignments.

Figure 2:
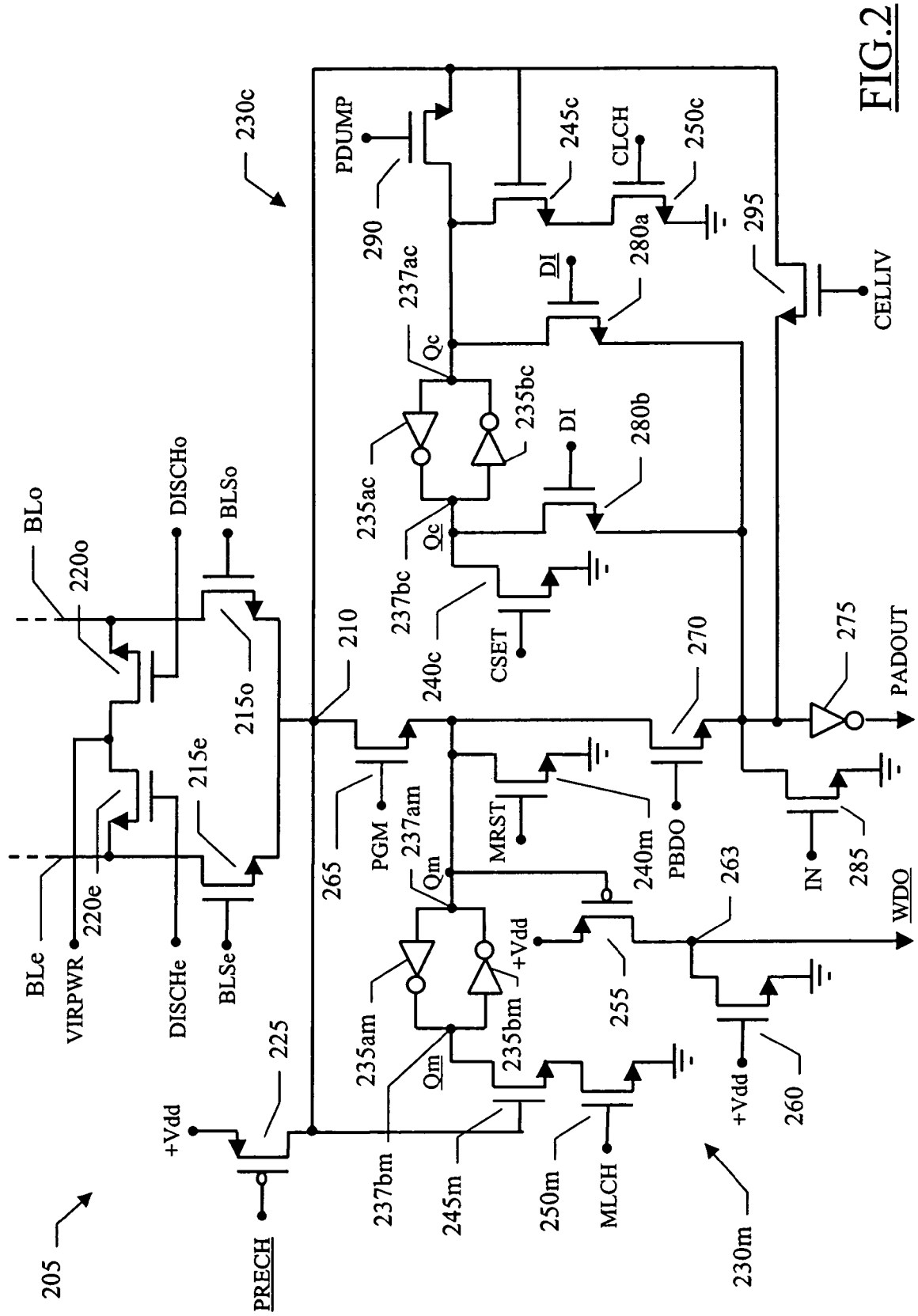
FIG. 2 is a simplified circuit scheme of a page buffer that can be used to practice the method.

As shown in FIG. 2, the page buffer includes a read/write unit 205 for each pair of adjacent bit lines (corresponding to cells having the same position in the two pages of each sector). Particularly, an even bit line and an odd bit line (denoted with BLe and BLo, respectively) are connected to an operative node 210 through respective NMOS transistors 215e and 215o. The transistors 215e,215o have the drain terminals connected to the corresponding bit lines BLe,BLo and the source terminals connected to the node 210; the gate terminals of the transistors 215e and 215o are controlled by select signals BLSe and BLSo, respectively. Two NMOS transistors 220e and 220o are used to discharge the respective bit lines BLe and BLo to a predefined biasing voltage VIRPWR (before any read/write operation). For this purpose, the transistors 220e,220o have the source terminals connected to the corresponding bit lines BLe,BLo; the drain terminals of the transistors 220e,220o are connected together to a terminal providing the biasing voltage VIRPWR. The gate terminals of the transistors 220e,220o are controlled by two discharge signals DISCHe and DISCHo, respectively.

A PMOS transistor 225 is used to pre-charge the node 210 at the beginning of the read/write operation. For this purpose, the transistor 225 has the drain terminal that is connected to the node 210 and the source terminal that is connected to a terminal providing a power supply voltage +Vdd (for example, 3V with reference to ground). The gate terminal of the transistor 225 is controlled by a pre-charge signal PRECH; the signal PRECH is underlined to denote that it is asserted at the logic value 0 (ground) and deasserted at the logic value 1 (+Vdd).

The read/write unit 205 includes a main latch 230m and a cache latch 230c. The cache latch 230c is used to enter the target value of a bit to be written into the corresponding selected cell; the main latch 230m is used to write the target value received from the cache latch 205m into the cell, or to read the value stored therein.

More in detail, the main latch 230m is formed by two inverters 235am and 235bm. The input terminal of the inverter 235am and the output terminal of the inverter 235bm are connected together to define an operative node 237am of the latch 230m, which provides a signal Qm; likewise, the output terminal of the inverter 235am and the input terminal of the inverter 235bm are connected together to define a further operative node 237bm, which provides a negated signal Qm.

An NMOS transistor 240m is used to reset the latch 230m. For this purpose, the transistor 240m has the drain terminal connected to the node 237am and the source terminal connected to a ground terminal; the gate terminal of the transistor 240m is controlled by a reset signal MRST. The main latch 230m is set by means of two NMOS transistors 245m and 250m that are connected in series. Particularly, the transistor 245m has the drain terminal connected to the node 237bm and the source terminal connected to the drain terminal of the transistor 250m; the source terminal of the transistor 250m is connected to the ground terminal. The gate terminal of the transistor 245m is controlled by the voltage at the node 210, while the gate terminal of the transistor 250m is controlled by a latching signal MLCH.

The main latch 230m further includes a pull-up PMOS transistor 255, which has the gate terminal connected to the node 237am and the source terminal connected to the power supply terminal. The drain terminal of the transistor 255 is connected to the drain terminal of a pull-down NMOS transistor 260; the transistor 260 has the gate terminal connected to the power supply terminal and the source terminal connected to the ground terminal. The drain terminals of the transistors 255 and 260 define a node 263 that provides a fault signal WDO.

An NMOS transistor 265 is used to couple the main latch 230m with the selected bit line BLe or BLo, in order to program the corresponding cell during the write operation. For this purpose, the transistor 265 has the source terminal that is connected to the node 237am and the drain terminal that is connected to the node 210; the gate terminal of the transistor 265 is controlled by a programming signal PGM. On the other hand, the value being detected by the main latch 230$m$ during the read operation is output by means of an NMOS transistor 270 and an inverter 275 that are connected in series. Particularly, the transistor 270 has the drain terminal that is connected to the node 237$am$, while its gate terminal is controlled by an enabling signal PBDO; the source terminal of the transistor 270 is connected to the input terminal of the inverter 275, which output terminal provides a signal PADOUT.

On the other hand, the cache latch 230$c$ is formed by two inverters 235$ac$ and 235$bc$. The input terminal of the inverter 235$ac$ and the output terminal of the inverter 235$bc$ are connected together to define an operative node 237$ac$ of the latch 230$c$, which provides a signal Qc; likewise, the output terminal of the inverter 235$ac$ and the input terminal of the inverter 235$bc$ are connected together to define a further operative node 237$bc$, which provides a negated signal $\overline{Qc}$.

An NMOS transistor 240$c$ is used to set the latch 230$c$. For this purpose, the transistor 240$c$ has the drain terminal connected to the node 237$bc$ and the source terminal connected to the ground terminal; the gate terminal of the transistor 240$c$ is controlled by a set signal CSET. The latch 230$c$ is reset by means of two NMOS transistors 245$c$ and 250$c$ that are connected in series. Particularly, the transistor 245$c$ has the drain terminal connected to the node 237$ac$ and the source terminal connected to the drain terminal of the transistor 250$c$; the source terminal of the transistor 250$c$ is connected to the ground terminal. The gate terminal of the transistor 245$c$ is controlled by the voltage at the node 210, while the gate terminal of the transistor 250$c$ is controlled by a latching signal CLCH.

Three NMOS transistors 280$a$, 280$b$ and 285 are used to enter the target value during an input phase at the beginning of the write operation. For this purpose, the transistor 280$a$ has the drain terminal that is connected to the node 237$ac$, and the transistor 280$b$ has the drain terminal that is connected to the node 237$bc$; the gate terminal of the transistor 280$b$ receives an input signal DI (representing the target value), while the gate terminal of the transistor 280$a$ receives a negated input signal $\overline{DI}$. The source terminals of the transistors 280$a$ and 280$b$ are connected to the input terminal of the inverter 275. The transistor 285 is used to bring that terminal to ground during the input phase. Particularly, the transistor 285 has the drain terminal that is connected to the input terminal of the inverter 275, and the source terminal that is connected to the ground terminal; the gate terminal of the transistor 285 is controlled by an enabling signal IN.

The cache latch 230$c$ further includes an NMOS transistor 290 for transferring the target value to the main latch 230$m$. For this purpose, the transistor 290 has the drain terminal that is connected to the node 237$ac$ and the source terminal that is connected to the node 210; the gate terminal of the transistor 290 is controlled by an enabling signal PDUMP. Moreover, an NMOS transistor 295 is used to access the selected bit line BLe or BLo directly for diagnostic purposes. Particularly, the transistor 295 has the drain terminal that is connected to the node 210 and the source terminal that is connected to the input terminal of the inverter 275; the gate terminal of the transistor 295 is controlled by an enabling signal CELLIV.

In a stand-by condition, all the above-described control signals are deasserted, so that the corresponding transistors are off.

Before any read/write operation on a selected bit line, such as the bit line BLe (similar considerations apply to the other bit line BLo), the corresponding signal DISCHe is asserted; as a consequence, the transistor 220$e$ turns on, so as to apply the biasing voltage VIRPWR to the bit line BLe.

At the beginning of the write operation, the target value is entered into the cache latch 230$c$. More in detail, the signal IN is asserted; as a consequence, the transistor 285 turns on and brings the source terminals of the transistors 280$a$ and 280$b$ to ground. The target value (represented by the signal DI) and its negated value (represented by the signal $\overline{DI}$) are then applied to the gate terminals of the transistors 280$b$ and 280$a$, respectively. Therefore, if the target value is 1 the transistor 280$b$ turns on (while the transistor 280$a$ remains off), so as to bring the node 237$bc$ to ground; in this way, the signal $\overline{Qc}$ is brought to the logic value 0 and the signal Qc is brought to the logic value 1. Conversely, if the target value is 0 the transistor 280$a$ turns on (while the transistor 280$b$ remains off), so as to bring the node 237$ac$ to ground; in this way, the signal Qc takes the logic value 0 and the signal $\overline{Qc}$ takes the logic value 1.

At the same time, the main latch 230$m$ is reset by asserting the signal MRST. As a result, the transistor 240$m$ turns on; in this way, the signal Qm is brought to the logic value 0 and the signal $\overline{Qm}$ is brought to the logic value 1.

The target value in the cache latch 230$m$ is then transferred to the main latch 230$m$ by asserting the signal PDUMP; therefore, the gate terminal of the transistor 245$m$ is brought to the voltage at the node 237$ac$; in this way, if the signal Qc is at the logic value 1 the transistor 245$m$ turns on, while if the signal Qc is at the logic value 0 the transistor 245$m$ remains off. The signal MLCH is then asserted, so as to turn on the transistor 250$m$. Therefore, if the transistor 245$m$ is on (Qc=1) the node 237$bm$ is brought to ground (with the signal $\overline{Qm}$ that takes the logic value 0 and the signal Qm that takes the logic value 1); conversely, if the transistor 245$m$ is off (Qc=0) the logic value in the main latch 230$m$ is not changed (with the signal $\overline{Qm}$ at the logic value 1 and the signal Qm at the logic value 0).

The node 237 am can now be connected to the selected bit line BLe by asserting the signal PGM, which turns on the corresponding transistor 265. In this way, when the selected cell is to be programmed (signal Qm at the logic value 0), the cell is biased so as to cause the injection of electric charges into its floating gate.

The selected cell is then read, in order to verify the success of the operation. First of all, the main latch 230$m$ is reset again by asserting the signal MRST. At the same time, the node 210 is pre-charged by asserting the signal $\overline{PRECH}$; as a consequence, the transistor 225 turns on and brings the node 210 to the power supply voltage +Vdd. The signal MLCH is then asserted, so as to turn on the transistor 250$m$. Therefore, if the selected cell is programmed and then non-conductive the node 210 remains at the power supply voltage +Vdd; the transistor 245$m$ then turns on, so as to bring the node 237$bm$ to ground (with the signal $\overline{Qm}$ that takes the logic value 0 and the signal Qm that takes the logic value 1). Conversely, if the selected cell is erased and then conductive the node 210 is bought to ground (through the corresponding string); the transistor 245$m$ then remains off and the logic value in the main latch 230$m$ is not changed (with the signal $\overline{Qm}$ at the logic value 1 and the signal Qm at the logic value 0).

When the selected cell has been programmed successfully (Qm=1) the transistor 255 remains off. Therefore, the node 263 is brought to ground by the transistor 260 (always on) and the signal $\overline{WDO}$ takes the logic value 0. Conversely, when the cell has not been programmed successfully (Qm=0) the transistor 255 turns on. The transistor 255 is dimensioned to have a current capability that is far higher than the one of the transistor 260; therefore, the node 263 is brought to the power supply voltage +Vdd and the signal WDO takes the logic value 1.

The signals WDO provided by all the main latches 230m and the target values in all the cache latches 230c are supplied to a logic circuit (not shown in the figure). The logic circuit verifies a compliance of the values actually stored in the page with the corresponding target values (i.e., whether the required cells have been programmed successfully). Whenever an error condition is detected, a corresponding signal indicative of the failure is asserted. In response thereto, the values in all the main latches 230m are output by asserting the signal PBDO. In this way, the signals PADOUT for the cells that have not been programmed successfully (Qm=0) are asserted. The corresponding columns can then be identified and disabled, so as to be replaced by corresponding redundant columns.

During the sequential program verify procedure, the same operations described above are repeated for each page of the memory device. However, the target word to be repeated throughout the whole matrix is maintained in the cache latches 230c (so as to avoid its re-entering at each program-verify step). When the sequential program-verify procedure is carried out programming all the cells, the input phase (with the corresponding transfer of the target values from the cache latches 230c to the main latches 230m) can be avoided. After each program-verify step, if one or more of the cells of the current page are not compliant with the desired values (i.e., whether they have not been programmed successfully) the signals PADOUT are output. This is necessary to avoid losing the corresponding information because of the reset of the main latches 230m at the next program-verify step.

Similar considerations apply if the read/write unit has another architecture or includes other components; for example, the read/write unit can be implemented with bipolar transistors, the latches can have a different structure, or equivalent control signals can be used.

The present invention is based on the intuition that in the above-described scenario only one latch of each read/write unit (i.e., the main latch 230m) is used during the sequential program-verify procedure. Therefore, in a preferred embodiment of the invention one of the latches (preferably the cache latch 230c) is used for carrying out the program-verify steps, while the other latch (i.e., the main latch 230m) is used to buffer the results of the verifications.

Figure 3:
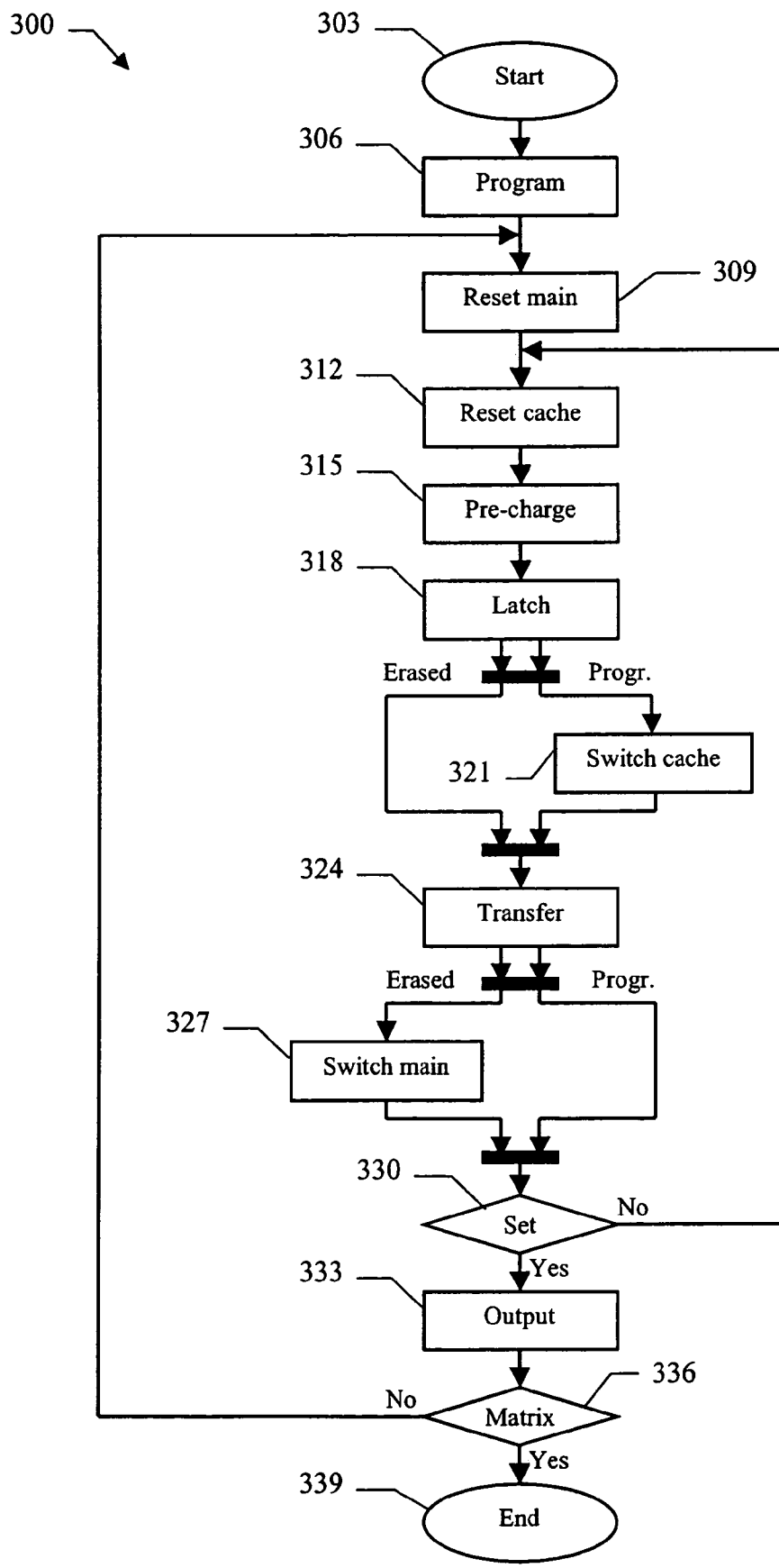
FIG. 3 shows a flow chart describing a process of testing the memory device according to an embodiment of the invention.

Considering now FIGS. 2 and 3 together, a corresponding method 300 begins at the start block 303. Proceeding to block 306, all the cells of the matrix are programmed. The method then continues to block 309, wherein each main latch 230m is reset by asserting the signal MRST (Qm=0 and Qm=1). A loop is then repeated for each one of the pages sharing a common set of columns.

The loop begins at block 312, wherein each cache latch 230c is set by asserting the signal CSET (Qc=0 and Qc=1). Continuing to block 315, the node 210 is pre-charged by asserting the signal PRECH (so as to bring the node 210 to the power supply voltage +Vdd). The signal CLCH is then asserted at block 318 to latch the value stored in the selected cell into the cache latch 230c.

In response thereto, the flow of activity forks according to the condition of the selected cell. Particularly, if the selected cell is programmed the cache latch 230c switches at block 321. Indeed, the cell is non-conductive so that the node 210 remains at the power supply voltage +Vdd; the transistor 245c then turns on and brings the node 237ac to ground (with the signal Qc that takes the logic value 0 and the signal Qc that takes the logic value 1). Conversely, if the selected cell is erased and then conductive the node 210 is bought to ground; the transistor 245c then remains off and the logic value in the cache latch 230c is not changed (with the signal Qc at the logic value 1 and the signal Qc at the logic value 0).

The method joints at block 324, wherein the signal PDUMP is asserted to transfer the value in the cache latch 230c to the main latch 230m. In response thereto, the flow of activity branches again according to the value in the cache latch 230c. Particularly, if the signal Qc is at the logic value 1 the main latch 230m switches at block 327 (Qm=0 and Qm=1). Conversely, if the signal Qc is at the logic value 0 the condition of the main latch 230m is not changed.

The method merges at test block 330. If the last page of the current set has not been reached, the flow of activity returns to block 312 for processing a next page of the set; it should be noted that during the iterations of the loop the content of the main latches 230m is updated only when an error condition is detected, so as to avoid loosing the results of the preceding steps. On the contrary, the method exits the above-described loop and descends into block 333.

The result of the verification of the pages of the current set is then output. Particularly, the signal PBDO is asserted. Therefore, if one or more of the cells belonging to each column of the set are defective (Qm=1), the output signal PADOUT is deasserted. In this way, the output signals PADOUT at the logic value 0 identify the columns of the set to be rejected.

Proceeding to block 336, a test is made to determine whether the last page of the matrix has been verified. If not, the method returns to block 309 to repeat the operations described above on the pages sharing a next set of common columns. Conversely, the method ends at the final block 339.

Similar considerations apply if the sequential program-verify procedure implements an equivalent method (for example, including additional steps). In any case, the concepts of the present invention are also applicable when the sequential program-verify procedure is applied to a sub-set of pages of the matrix, or when the memory device is subjected to an equivalent testing procedure. Moreover, when the flash memory includes multiple matrices, the same operations described above (steps 309–336) are repeated twice or more times.

More generally, one embodiment of the present invention proposes a sequential program-verify method for use in a non-volatile memory device. The memory device includes a plurality of memory cells each one for storing a logic value; the cells are arranged into a plurality of alignments. The method starts with the step of writing a set of target values into a plurality of blocks of cells (with the corresponding cells of each block that belong to a common alignment). Each block of cells is then verified in succession, in order to assert a fault value for each alignment (in response to a non-compliance of the value stored in the cell of the block belonging to the alignment with the corresponding target value). In the method, the fault values are buffered. In response to the verification of all the blocks of cells, an indication of the alignments being defective is then provided according to the fault values.

The solution of the invention avoids suspending the procedure whenever an error condition is detected.

Indeed, in the proposed method the results of the verifications are accumulated, so as to be output at the end of the procedure.

As a consequence, the length of the procedure is substantially reduced.

Particularly, the solution of the invention allows improving the performance of the production process of the memory devices, with a corresponding reduction of their overall cost.

The preferred embodiment of the invention described above offers further advantages.

Particularly, the cells of all the pages to be verified are programmed.

In this way, the method can be implemented with a standard page buffer.

The method is specifically designed for use in a memory device having a page buffer with two latches for each read/write unit.

Therefore, a latch can be used for reading the cell to be verified and the other latch can be used for buffering the result of the verification.

However, the method leads itself to be carried out even with a different data pattern, or with a page buffer having another structure (for example, allowing latching the data pattern and buffering the result of the verification at the same time).

As a further improvement, the latch buffering the result of the verification is set according to the content of the other latch.

This solution allows exploiting standard features provided by the page buffer.

A suggested choice for implementing the above-mentioned step is that of resetting the latch that will be used for buffering the result of the verification at the beginning of the procedure; this latch is then coupled to the other latch after verifying each page (so as to switch only when the content of the other latch indicates that the corresponding cell has not been programmed successfully).

The proposed method automatically avoids any loss of information relating to the results of the previous verifications.

However, the implementation of the solution of the invention by controlling the latches of the page buffer in another way is not excluded. For example, in a different embodiment a generic data pattern is loaded into the cache latches, and then transferred to the main latches. Each step of the procedure involves returning the target values (in the main latches) to the cache latches. Each cell of the current page is read into the corresponding cache latch, so as to cause its switching if the stored value is different from the target one. The cache latches are then coupled with the main latches; in this way, any error causes the switching of the corresponding main latch. At the end of the procedure, the values in the main latches are output and compared with the target values; as a consequence, each difference in the pairs of values indicates that the corresponding column is defective. Alternatively, a dedicated logic circuit can be used for comparing the read value with the expected one and set the fault value accordingly; whenever an error condition is detected, the logic circuit is disabled so as to avoid verifying the next cells of a defective column uselessly.

In a preferred embodiment, the cache latch is used to verify the cell and the main latch is used to buffer the result of the verification.

In this way, the method can be implemented exploiting features that are already available for the standard read/write operations. Nevertheless, it is emphasized that this result is surprisingly achieved using the two latches with an opposite function as compared with their standard operative mode.

Without detracting from its general applicability, the method of the invention is specifically designed for use in a NAND flash memory.

Indeed, the page buffer commonly available in this kind of memory devices is well suited for the implementation of the devised method.

Advantageously, the solution according to the present invention is implemented with a software program, which is embodied in a storage component.

However, the use of the main and cache latches in a different way is not excluded. In any case, the application of the proposed method in a NOR flash memory or more generally in any other non-volatile memory device is contemplated. Moreover, the software program can be provided in any other form directly loadable into a working memory of the micro-controller, or the method can be implemented with a hardware structure or a combination of software and hardware.

Naturally, in order to satisfy local and specific requirements, a person skilled in the art may apply to the solution described above many modifications and alterations all of which, however, are included within the scope of protection of the invention as defined by the following claims.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The invention claimed is:

1. A sequential program-verify method for use in a non-volatile memory device including a plurality of memory cells each one for storing a logic value, the cells being arranged into a plurality of alignments, the method comprising:

writing a set of target values into a plurality of blocks of cells, the corresponding cells of each block belonging to a common one of the alignments;

verifying each block of cells in succession to assert a fault value for each alignment in response to a non-compliance of the value stored in the cell of the block belonging to the alignment with the corresponding target value;

buffering the fault values; and in response to the verification of all the blocks of cells, providing an indication of the alignments being defective according to the fault values, wherein the memory device further includes a plurality of read/write units each one having a first latch and a second latch, and means for selectively coupling each read/write unit with the cells belonging to a corresponding one of the alignments, and wherein:

the verifying step includes reading the block of cells into the corresponding second latches, and the buffering step includes latching the fault values into the corresponding first latches.

2. The method according to claim 1 wherein the step of writing includes programming all the blocks of cells.

3. The method according to claim 1, wherein the step of latching the fault values includes:

setting each first latch according to the value latched in the corresponding second latch.

4. The method according to claim 3, further including the step of:

resetting each first latch to a condition corresponding to the deassertion of the fault value before verifying the blocks of cells, wherein:

the step of setting each first latch according to the value latched in the corresponding second latch including coupling the first latch with the second latch to leave the first latch unaffected when the value latched in the second latch is indicative of successfully programming of the corresponding cell or to switch the first latch to a further condition corresponding to the assertion of the fault value otherwise.

5. The method according to claim 1, wherein the second latch is a cache latch for inputting a value to be written into the corresponding cell, and wherein the first latch is a main latch for receiving the value latched in the second latch and programming the corresponding cell accordingly.

6. The method according to claim 1 wherein the memory device includes a flash memory with NAND architecture.

7. A logic controller readable medium including a program code for a logic controller in a non-volatile memory device including a plurality of memory cells each one for storing a logic value, the cells being arranged into a plurality of alignments, wherein, when the program code is run on the controller, the program code causes the controller to perform a method comprising:

writing a set of target values into a plurality of blocks of cells, the corresponding cells of each block belonging to a common one of the alignments;

verifying block of cells in succession to assert a fault value for each alignment in response to a non-compliance of the value stored in the cell of the block belonging to the alignment with the corresponding target value;

buffering the fault values; and in response to the verification on of all the blocks of cells, providing an indication of the alignments being defective according to the fault values, wherein the memory device further includes a plurality of read/write units each one having a first latch and a second latch, and means for selectively coupling each read/write unit with the cells belonging to a corresponding one of the alignments, and wherein:

verifying includes reading the block of cells into the corresponding second latches, and buffering includes latching the fault values into the corresponding first latches.

8. The logic controller readable medium according to claim 7 wherein latching the fault values includes:

setting each first latch according to the value latched in the corresponding second latch.

9. The logic controller readable medium according to claim 8, wherein the program code also causes the controller to:

reset each first latch to a condition corresponding to the deassertion of the fault value before verifying the blocks of cells, wherein:

setting each first latch according to the value latched in the corresponding second latch includes coupling the first latch with the second latch to leave the first latch unaffected when the value latched in the second latch is indicative of the successfully programming of the corresponding cell or to switch the first latch to a further condition corresponding to the assertion of the fault value otherwise.

10. The logic controller readable medium according to claim 7, wherein the second latch is a cache latch for inputting a value to be written into the corresponding cell, and wherein the first latch is a main latch for receiving the value latched in the second latch and programming the corresponding cell accordingly.

11. A non-volatile memory device, comprising:

a plurality of memory cells each one for storing a logic value, the cells being arranged into a plurality of alignments;

means for writing a set of target values into a plurality of blocks of the cells, the corresponding cells of each block belonging to a common one of the alignments;

means for verifying each block of cells in succession to assert a fault value for each alignment in response to a non-compliance of the value stored in one of the cells of the block belonging to the alignment with the corresponding target value;

means for buffering the fault values; and means responsive to the verification of all the blocks of cells for providing an indication of the alignments being defective according to the fault values, wherein the means for buffering include a first latch that latches the fault values and the means for verifying include a second latch that receives logic values read from each block of cells.

12. The memory device according to claim 11 wherein the means for buffering include means for setting the first latch according to the value latched in the second latch.

13. The memory device according to claim 11, further including:

means for resetting each first latch to a condition corresponding to the deassertion of the fault value before verifying the blocks of cells, wherein:

the means for setting each first latch include means for coupling the first latch with the second latch to leave the first latch unaffected when the value latched in the second latch is indicative of successfully programming of the corresponding cell or to switch the first latch to a further condition corresponding to the assertion of the fault value otherwise.

14. The memory device according to claim 11, wherein the second latch is a cache latch for inputting a value to be written into the corresponding cell, and wherein the first latch is a main latch for receiving the value latched in the second latch and programming the corresponding cell accordingly.

15. The memory device according to claim 11 wherein the plurality of memory cells is of a flash memory with NAND architecture.

* * * * *